United States Patent
Nguyen et al.

(10) Patent No.: US 6,778,285 B1
(45) Date of Patent: Aug. 17, 2004

(54) AUTOMATIC IN SITU PELLICLE HEIGHT MEASUREMENT SYSTEM

(75) Inventors: Phong Nguyen, Vancouver, WA (US); Ming-Chun Chou, Vancouver, WA (US); Marvin Mills, Washougal, WA (US)

(73) Assignee: Wafertech, Inc., Camas, WA (US)

( * ) Notice: Subject to any disclaimer, the term of this patent is extended or adjusted under 35 U.S.C. 154(b) by 0 days.

(21) Appl. No.: 09/489,461

(22) Filed: Jan. 21, 2000

(51) Int. Cl.⁷ .................................................. G01C 11/12
(52) U.S. Cl. .................................................... 356/630
(58) Field of Search ................................ 356/630–632, 356/436–440, 624, 601; 250/559.27, 559.28

(56) References Cited

U.S. PATENT DOCUMENTS

| | | | |
|---|---|---|---|
| 5,717,198 A | * 2/1998 | Broude et al. | 250/559.47 |
| 6,133,999 A | * 10/2000 | Myers et al. | 356/632 |
| 6,323,954 B1 | * 11/2001 | Halter | 356/624 |

* cited by examiner

Primary Examiner—Frank G. Font
Assistant Examiner—Amanda Merlino
(74) Attorney, Agent, or Firm—Duane Morris LLP

(57) ABSTRACT

A method for measuring a thickness of a photolithography element, such as a pellicle, includes projecting a light beam from a first side of the pellicle and at a plane above a first surface of the pellicle, projecting the light beam from the first side of the pellicle and at a plane corresponding to a plane of the pellicle, and projecting the light beam from the first side of the pellicle and at a plane below a second surface of the pellicle. The light beam can be projected from a laser light source. The light beams are projected at different media above and below the pellicle. The light beams pass through the first side of the different media and exit at a second side opposite to the first side at different intensities. The light beam may not pass through the pellicle if the light beam is incident to an opaque pellicle frame, and thus has minimal intensity at the second side. The resulting intensity of the projected light beams is detected at the second side by a detector, and an index corresponding to each detected resulting intensity is generated. The thickness of the pellicle is determined based on the generated indexes.

20 Claims, 2 Drawing Sheets

AUTOMATIC IN SITU PELLICLE HEIGHT MEASUREMENT SYSTEM

BACKGROUND OF THE INVENTION

1. Field of the Invention

The present invention relates generally to integrated circuit fabrication tools, and more particularly, relates to a method and apparatus to measure pellicle height.

2. Background Information

Photolithography is a process that is commonly used in the manufacture of integrated circuits. The process involves the deposition of a photoresist layer onto an underlying substrate layer. The photoresist is then selectively exposed to light, which chemically alters the photoresist. If the photoresist is a positive type, then areas where the photoresist are exposed to light are selectively removed order to obtain the circuit pattern.

The pattern that is projected onto the photoresist is contained on a mask placed within a photolithography exposure tool or stepper. A stepper includes a light source, stepper controller (e.g., an aligner), and a reticle table. A mask, also referred to as a reticle, is placed on the reticle table between the light source and the photoresist layer. The reticle is typically formed from an opaque film of patterned chromium placed on a transparent blank typically made of a glass or quartz material. The pattern is transferred onto the photoresist by projecting an image of the reticle onto the photoresist using an exposing radiation from the light source. In this manner, the pattern of opaque chromium placed on the transparent blank defines the areas through which the exposing radiation passes, thereby exposing selective regions of the underlying photoresist.

The patterned chromium film on the reticle blank includes lines and line spacings of less than 10 microns. Depending on a reduction factor, line width, and line spacing, geometries for a resulting semiconductor device can range from less than 10 microns to less than two microns. When working with such small geometries, it is important that the reticle and other components in the fabrication processes be free of contamination. Even the smallest piece of foreign contamination can produce an image on the photoresist.

Therefore, in many applications, the reticle is covered by a pellicle. A pellicle (sometimes referred to as a pellicle membrane) is a thin film of optical grade polymer that is stretched on a pellicle frame and secured to the reticle. The pellicle frame is often made of a rigid and durable material, such as aluminum, so that the fragile pellicle may be handled during transport or during the photolithography process without damage. The pellicle's purpose is to prevent airborne contaminants from collecting on the mask. During the exposure, the pellicle holds the contaminants out of the focal plane, and hence, the contaminants do not print on the wafer.

Complex circuit patterns typically require multiple exposure and development steps. In some instances, multiple copies of circuit patterns are repeatedly projected onto different surface regions on a single wafer, thereby allowing several identical integrated chips to be manufactured from the same wafer. The wafer is then subsequently cut into a plurality of identical, individual chips. In the case of a large circuit pattern, sections of the pattern may be exposed and developed individually rather than the circuit pattern as a whole. The stepper controller controls the movement and positioning of the reticle as it moves across different regions of a wafer during the photolithography process.

Because of these complex or multiple patterns, reticles in the stepper often have to be repeatedly switched or removed during the photolithography process. Removal of a reticle may also be required if a "worn out" reticle (e.g., a reticle distorted in some manner due to damage, heavy use, or dirt accumulation) needs to replaced by another reticle.

Because the pellicle-reticle assembly is continuously being exposed to the light source and because of other factors present in the photolithography process, the pellicle (including the pellicle frame) and the reticle can heat up. The heat causes these components to expand, which can have very detrimental effects when these components are repeatedly removed from or inserted into the stepper as mentioned above. That is, the expanded size could undesirably result in contact between the pellicle and a component of the stepper (such as optical machinery) when the pellicle-reticle assembly is removed from the stepper. This contact can scratch fragile components of the stepper or damage the pellicle. Scratched stepper components can result in out-of-focus imaging or improper positioning of the reticle, which ultimately decreases die yield and productivity. A scratched pellicle can introduce contaminants onto the reticle image. Furthermore, replacement of a damaged pellicle and reticle assembly can be expensive, especially if several wafers are exposed and developed before the damage to the pellicle is uncovered.

Accordingly, there is a need to be able determine the height of a pellicle to determine if it has exceeded acceptable tolerances.

SUMMARY OF THE INVENTION

According to one aspect of the invention, a method for measuring a thickness of a pellicle is provided. The method includes projecting a light beam from a first side of the pellicle and at a plane above a first surface of the pellicle, projecting the light beam from the first side of the pellicle and at a plane corresponding to a plane of the pellicle, and projecting the light beam from the first side of the pellicle and at a plane below a second surface of the pellicle. The resulting intensity of the projected light beams is detected at a second side of the pellicle opposite to the first side, and an index corresponding to each detected resulting intensity is generated. The thickness of the pellicle is determined based on the generated indexes.

BRIEF DESCRIPTION OF DRAWINGS

Non-limiting and non-exhaustive embodiments of the present invention will be described in the following figures, wherein like reference numerals refer to like parts throughout the various views unless otherwise specified.

DETAILED DESCRIPTION OF THE ILLUSTRATED EMBODIMENTS

Embodiments of an apparatus and method for automatic in situ pellicle height measurement are described in detail herein. In the following description, numerous specific details are provided, such as the description of components of a stepper, such as that shown in FIG. 2, to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Figure 1:
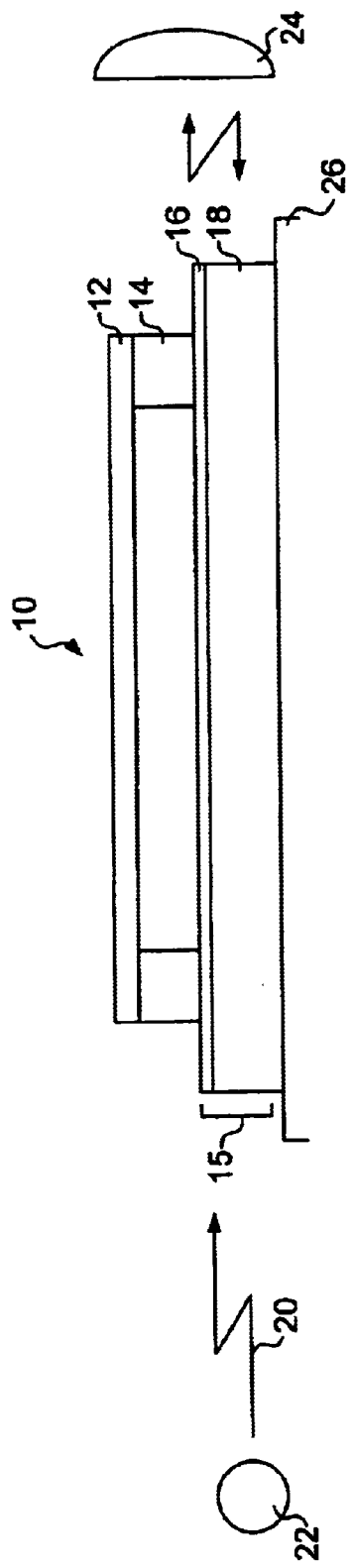
FIG. 1 shows a method and apparatus to measure pellicle height according to an embodiment of the invention.

Referring first to FIG. 1, an embodiment of an apparatus and method for measuring pellicle height is shown. A pellicle-reticle assembly 10 includes a pellicle membrane 12 mounted (e.g., glued) onto a pellicle frame 14. A reticle 15 includes a chromium pattern 16 placed on a blank 18. The pellicle frame 14 and pellicle membrane 12 are positioned over and attached to the reticle 15 such that the pellicle membrane 12 keeps foreign particles off the focal plane of the pattern 16.

According to conventional configurations and materials, the pellicle membrane 12 can be an optical grade, transparent polymer, such as nitrocellulose or cellulose acetate, having a thickness of 0.8 to 2.5 microns, for example. The pellicle frame can be made of a suitable rigid material, such as aluminum. The combined thickness of the pellicle membrane 12 and pellicle frame 14 can vary between 4.5 and 5.5 mm, although as previously discussed above, this thickness tends to increase as these component heat up during use.

Also according to conventional configurations and materials, the pattern 16 can be made of an opaque material, such as chromium, and it is understood that persons skilled in the art can choose other types of materials that are suitable for use as a mask. The pattern 16 can have a thickness 100 nm or less. The blank 18 can be made from glass, quartz, soda lime, borosilicate glass, fused silica, or other sufficiently transparent material. A suitable thickness of the reticle 15 can be 0.25 inches, and with an overall surface area of 6 square inches. Again, the thickness of the reticle 15 (e.g., the thickness of both the pattern 16 and the blank 18) can increase during use as the reticle 15 heats up.

Because of the transparency of the blank 16 and considering that the opaque pattern 16 has a very thin profile compared to the transparent profile of the blank 16, the reticle 15 is sufficiently transparent to a horizontal light beam 20 that is incident to its sides. According to similar reasoning, because the pellicle frame 14 is made of an opaque material (and considering that the thickness of the transparent pellicle membrane 12 is negligible compared to the thickness of the pellicle frame 14), the light beam 20 horizontally incident to one side of the pellicle frame 14 will not pass through to the opposite side of the pellicle frame 14.

Therefore, according to an embodiment of the invention, a light source 22 generates the light beam 20, which is made incident to the common sides of the pellicle frame 14 and reticle 15. In other words, if the light beam 20 is aimed perpendicularly to one side of the pellicle-reticle assembly 10 (e.g., aimed at zero degrees from horizontal), the light that passes through to the other side of the pellicle-reticle assembly 10 can be sensed by detector 24 positioned on the other side. The detector 24 can comprise one or more photodiodes, phototransistors, or other similar devices that can detect varying intensities of light and convert the detected light into electronic signals representative of the intensity of the detected light.

These electronic signals can then be assigned with suitable indexes. For instance, the brightest light detected can be assigned "10.0", while "0.0" can be assigned to no light detected (or to a very minimum amount detected). Thus, if the light beam 20 passes through free space above the surface of pellicle membrane 12, the light detected by the detector 24 has the highest intensity and can be assigned a 10,0 index. If the light beam 20 is incident against the side of the pellicle frame 14, then generally light does not pass through (except for light that may pass through the thin pellicle membrane 12), and therefore, the detector 24 detects minimum or no light, and generates a 0.0 or 0.1 index, for example. If the light beam 20 is incident against the side of the reticle 15, it may be filtered to an extent by the transparent blank 18, and therefore, the light detected by the detector 24 corresponds to a 0.7 index, for example. Again, it is noted that the thicknesses of the pellicle membrane 12 (transparent) and the pattern 16 (opaque) are negligible in comparison to the thicknesses of the pellicle frame 14 and the blank 18, and therefore, these thin components do not have a significant influence on the detected light. However, it is understood that it is possible to provide embodiments of the invention where the detector 24 is sufficiently sensitive to detect light that is passed (or not passed) by these thin components.

According to an embodiment of the invention, the light beam 20 can comprise laser light or another type of light having a wavelength less than the typical 4.5–5.5 mm thickness of the pellicle frame 14. The wavelength of the light beam 20 is generally chosen to be less than the thickness of the component to which it is incident in order to determine thickness variation.

Measurement of the pellicle height can be performed as follows. The pellicle-reticle assembly 10 is suitably attached to or mounted on a movable member 26. The movable member 26 can be a component of a stepper, for example, that functions to insert/remove the pellicle-reticle assembly 10 from the stepper or to otherwise change position of the pellicle-reticle assembly 10 within the stepper. The light source 22 and detector 24 are kept stationary with respect to the movable member 26. In other embodiments, the light source 22 and detector 24 can be the movable components if the movable member 26 is kept stationary.

The movable member 26 is raised or lowered from an initial position at a given speed. As the pellicle-reticle assembly 10 moves vertically, the stationary light beam 20 is aimed at the side of the pellicle-retical assembly 10, with the detector 24 detecting the corresponding amount of light passing through the other side of the pellicle-reticle assembly 10. A change in indexes, therefore, occurs at a position or plane just above the pellicle frame 14 where there is free space and at a position just below the pellicle frame 14 occupied by the reticle 15. If the speed of movement of the movable member 26 is known, the various thicknesses can be obtained by multiplying the known speed by the time taken to change from one index to another index.

In another embodiment, the thickness can be determined by sequentially aiming a single light beam 20 in vertical increments of 1 mm, for example, along the side of the pellicle-reticle assembly 10, and obtaining the index at each vertical increment. Thus, the thickness is determined by reviewing the indexes at the specific vertical increments/locations where the indexes change. A possible variation of this method can use a sequential plurality of light beams 20 and a corresponding plurality of detectors 24 positioned in 1 mm vertical increments, for example, and obtaining the index at each detector 24. In yet another embodiment, a single light beam 20 can be aimed at a fixed height or location predetermined to be a maximum possibe height allowable for expansion by the pellicle frame 14. This location can be somewhere above the surface of the pellicle membrane 12, for example. While the pellicle frame 14 (and pellicle membrane 12) are within acceptable thicknesses, the single light beam 20 results in an index at the detector 24 that corresponds to light projected through free space. Once the pellicle frame 14 or pellicle membrane 12 have reached the fixed height of the light beam, however, then the index at the detector 24 will change, indicating that expansion tolerances have been exceeded. Other variations to these and other embodiments can be used to derive the thickness of the different components of the pellicle-reticle assembly 10 by using the value of the derived indexes.

The horizontal distance of the light source 22 and the detector 24 from the sides of the pellicle-reticle assembly 10 can be chosen to minimize the effects of scattering and to maximize the light contrasts of the detected light so that the indexes can be accurately generated. The distance of the light source 22 and the detector 24 may vary from one application to another. For example, a range of distances from the light source 22 to the side of the pellicle-reticle assembly 10 can be between 5–15 cm, and a range from the opposite side of the pellicle-reticle assembly 10 to the detector 24 can be between 5–15 cm.

Figure 2:
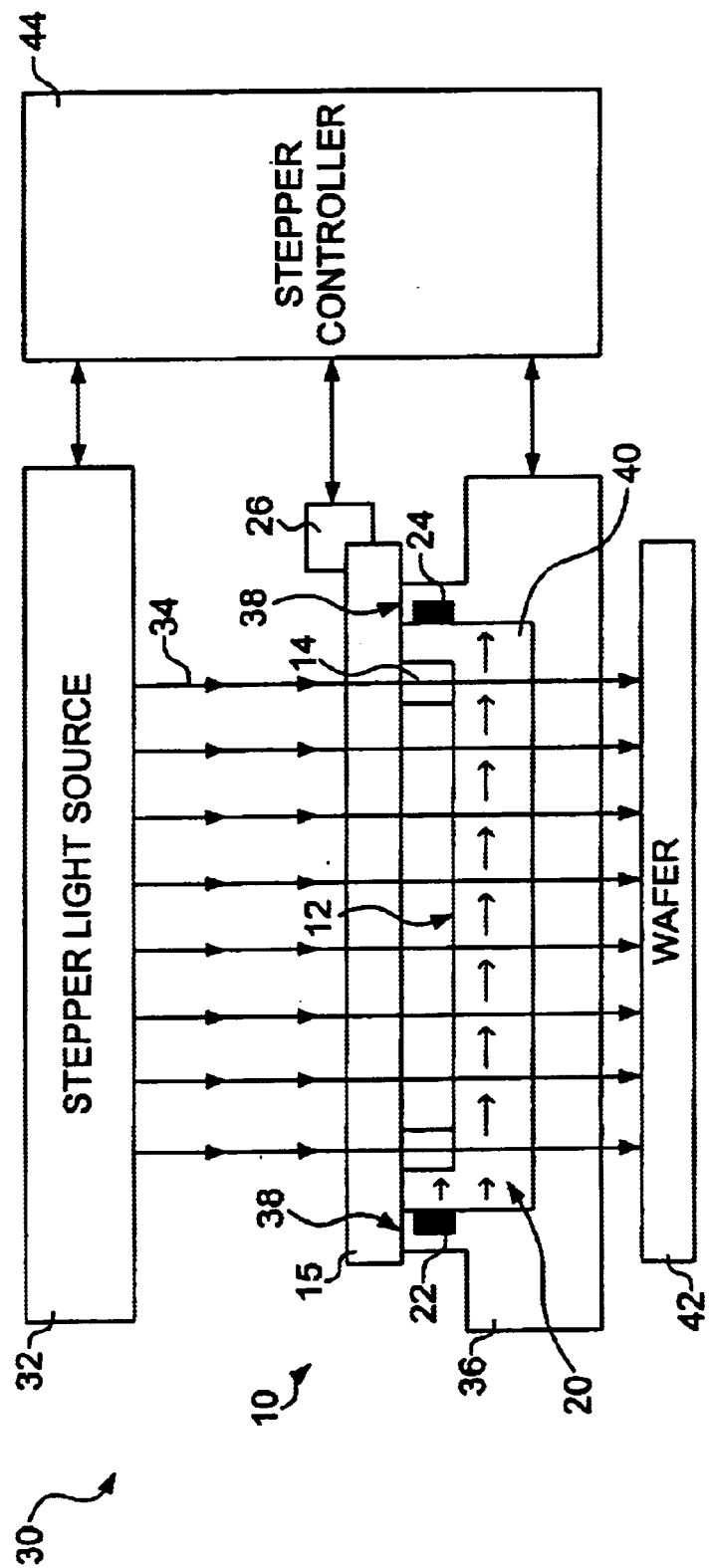
FIG. 2 shows how an embodiment of the invention can be implemented in a photolithography device.

Referring next to FIG. 2, shown generally at 30 is a stepper or other photolithography device that can implement an embodiment of the invention. The stepper 30 includes a stepper light source 32 to generate light 34 for the photolithography process. One or more optical lenses (not shown) may be positioned under the stepper light source 32. The pellicle-reticle assembly 10, comprised of the reticle 15 and the pellicle frame 14 (having the pellicle membrane 12 attached thereto), is mounted on a reticle table 36. In the embodiment shown in FIG. 2, the reticle 15 sits on surface(s) 38 of the reticle table 36. Other embodiments and configurations other than what is shown in FIG. 2 are possible. For example, while FIG. 2 shows the pellicle-reticle assembly 10 having the reticle 15 positioned between the stepper light source 32 and the pellicle frame 14, it is possible to have applications where the pellicle-reticle assembly 10 is oriented such that the pellicle frame 14 is between the stepper light source 32 and the reticle 15.

In the embodiment shown in FIG. 2, the light 34 passes through the pellicle-reticle assembly 10, then through an opening 40 in the reticle table 36, and onto a semiconductor wafer 42. As can be seen, the pellicle frame 14 and the pellicle membrane 12 are positioned within the opening 40. A stepper controller 44 controls the relative positioning of the stepper light source 32 and the reticle table 36.

According to conventional steppers and processes as described above, the pellicle-reticle assembly 10 heats up and expands while in use, which can result in undesirable contact between the reticle table 36 and the pellicle frame 14 or the pellicle membrane 12. Specifically, if the pellicle frame 14 has expanded during use, the expansion may exceed designed space tolerances, therefore causing the pellicle frame 14 to contact and scratch the surface(s) 38 (or other surfaces, such as surfaces of optical components) of the reticle table 36 when the pellicle-reticle assembly 10 is lifted above and moved off the reticle table 36. The scratched surface(s) 38 of the reticle table 36 can result in improper positioning of subsequent reticles 15 that are placed on the reticle table 36, thereby resulting in poor image focusing. Additionally, contact with the surfaces 38 (or with other surfaces) can result in scratches or other damage to the pellicle frame 14 or to the fragile pellicle membrane 12.

Accordingly, an embodiment of the invention positions the light source 22 on one side of the opening 40, and positions the detector 24 on an opposite side of the opening 40. In this manner, the light beam 20 is projected from one side of the opening 40 to an opposite side, and the detector 24 on the opposite side can derive an index. Other orientations or positions of the light source 22 and the detector 24 in the stepper 30 can be provided so long as the principles illustrated in FIG. 1 and described above are used. The movable member 26 controls the upward and downward movement of the pellicle-reticle assembly 10 as it is positioned on and lifted out of the reticle table 36.

The light source 22, detector 24, and movable member 26 are suitably electrically connected to and controlled by the stepper controller 44 or other controller (not shown). In this manner, the light indexes corresponding to the light detected by the detector 24, in a manner described above with reference to FIG. 1, can be used by the stepper controller to calculate changes in dimension/thickness of the pellicle frame 14.

The different methods described with reference to FIG. 1 can be used to calculate the thickness of the pellicle frame 14. For example, if the speed to lower the pellicle frame 14 into the opening 40 or to lift it out of the opening 40 by the movable member 26 is known, the time for the indexes to change can be multiplied by the known speed to calculate the thickness of the pellicle frame 14. In other embodiments, while the pellicle-reticle assembly 10 is stationary, multiple light sources 22 and a corresponding plurality of detectors 24 at incremental vertical heights can be used to generate indexes at each vertical position and then to derive thicknesses by comparing indexes at each position. In yet other embodiments, a single light beam 20 can be positioned at a level corresponding to a maximum height or thickness allowable for the pellicle frame 14 (or pellicle membrane 12). Once this level is reached or exceeded due to heat expansion, a change in index is detected at the detector 24.

The indexes can be used by the stepper controller 44 to control the operation of the movable member 26. Thus, if the width of the pellicle frame 14 has been determined to have exceeded allowable tolerances, then the stepper controller can halt further operation (e.g., preclude the movable member 26 from further lifting the pellicle-reticle assembly 10 off the reticle table 36) until the pellicle frame 14 has cooled and reduced its thickness back to acceptable tolerances. Again, it is noted that more sensitive embodiments of the invention can provide measurements and indexes that can detect changes in thicknesses of thin components such as those of the pellicle membrane 12 and pattern 16.

Embodiments of the invention thus provide an in-line pellicle height measurement method, apparatus, and system. The various described embodiments provide a non-intrusive and automatic technique to measure thicknesses in situ, while the pellicle-reticle assembly 10 is still in the stepper 30. Accordingly, pellicle-related defects, such as damage to the stepper 30 or to the pellicle membrane 12, can be significantly curtailed.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For example, although measurement of pellicle height has been described herein, it is to be appreciated that other embodiments of the invention can use principles of the invention to measure reticle height or the combined height of both the reticle and the pellicle in a pellicle-reticle assembly.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for measuring a dimension of a pellicle, the method comprising:

projecting a light beam from a first side of the pellicle and at a first plane above a first surface of the pellicle;

projecting the Light beam from the first side of the pellicle and at a second plane corresponding to a plane of the pellicle;

projecting the light beam from the first side of the pellicle and at a third plane below a second surface of the pellicle;

at a second side of the pellicle opposite to the first side, detecting a resulting intensity of the projected light beams and generating an index corresponding to each resulting intensity; and determining the thickness of the pellicle based on the generated indexes.

2. The method of claim 1 wherein projecting the light beam from the first side comprises projecting the light beam from a laser light source.

3. The method of claim 1 wherein detecting the resulting intensity of the projected light beams comprises using a photo diode to detect the resulting intensity.

4. The method of claim 1, further comprising:

keeping the projected light beam stationary and moving, at a speed, the pellicle relative to the stationary light beam; and determining the thickness of the pellicle by multiplying the speed of the pellicle by a time taken for the generated indexes to change as the pellicle moves.

5. The method of claim 1 wherein the pellicle comprises a pellicle membrane and a pellicle frame, and wherein projecting the light beam at the second plane corresponding to the plane of the pellicle comprises projecting the light beam incident to a side of the pellicle frame.

6. The method of claim 1 wherein the light beams are projected from a plurality of light sources positioned at different planes relative to the pellicle and the resulting light intensities are detected by a corresponding plurality of detectors.

7. The method of claim 1 wherein projecting the light beams at the first, second, and third planes comprises moving a single light beam relative to the pellicle.

8. The method of claim 1 wherein projecting the light beams comprises projecting the light beams at a substantially parallel position relative to the first and second surfaces of the pellicle.

9. The method of claim 1 wherein determining the thickness of the pellicle based on the generated indexes comprising comparing indexes generated at incremental planes and locating changes in the indexes substantially corresponding to end points of the pellicle.

10. An apparatus to measure a dimension of a photolithography element, the apparatus comprising:

a light source positionable at a first side of the photolithography element, the light source operative to project light beams at a first plane above a first surface of the photolithography element, at a second plane corresponding to a plane of the photolithography element, and at a third plane below a second surface of the photolithography element; and a detector unit positionable at a second side of the photolithography element opposite to the first side, the detector unit operable to detect a resulting intensity of the projected light beams and to determine a thickness of the photolithography element based on the detected resulting intensity.

11. The apparatus of claim 10, further comprising a movable member to move the photolithography element relative to the light source and to the detector unit, the detector unit operable to determine the thickness of the photolithography clement by multiplying a speed of the movable member with a time to change the resulting intensities.

12. The apparatus of claim 10 wherein the detector unit generates an index corresponding to the detected resulting intensity of the projected light beams.

13. The apparatus of claim 10 wherein the light source comprises a laser light source and the detector unit comprises a photodiode.

14. The apparatus of claim 10 wherein the photolithography element comprises a pellicle.

15. A photolithography system, comprising:

a controller;

a light source positionable at a fist side of a photolithography element, the light source operative to project light beams at a first plane above a first surface of the photolithography element, at a second plane corresponding to a plane of the photolithography element, and at a third plane below a second surface of the photolithography element; and a detector unit coupled to the controller and positionable at a second side of the photolithography element opposite to the first side, the detector unit being operable to detect a resulting intensity of the projected light beams, the controller operable to determine a thickness of the photolithography element based on the detected resulting intensity and operable to control movement of the photolithography element based on the determined thickness of the photolithography element.

16. The system of claim 15 wherein the photolithography element comprises a pellicle.

17. The system of claim 15 wherein the light source comprises a laser light source.

18. The system of claim 15 wherein the light source comprises a plurality of light sources positioned at incremental planes on the first side of the photolithography element and wherein the detector unit comprises a corresponding plurality of detectors positioned at the second side of the photolithography element.

19. The system of claim 15, further comprising a movable member to move the photolithography element relative to the light source and to the detector unit, the controller operable to determine the thickness of the photolithography element by multiplying a speed of the movable member with a time to change the resulting intensities.

20. The system of claim 15 wherein the controller determines the thickness of the photolithography element while the photolithography element is in situ.

* * * * *

UNITED STATES PATENT AND TRADEMARK OFFICE
CERTIFICATE OF CORRECTION

PATENT NO.   : 6,778,285 B1
DATED        : August 17, 2004
INVENTOR(S)  : Phong Hguyen, Ming-Chun Chou and Marvin Mills It is certified that error appears in the above-identified patent and that said Letters Patent is hereby corrected as shown below:

Column 7,
Lines 55 and 56, delete "comprising" and insert therefor -- comprises --;

Column 8,
Line 15, delete "clement" and insert therefor -- element --; and
Line 28, delete "fist" and insert therefor -- first --.

Signed and Sealed this

Fourteenth Day of December, 2004

JON W. DUDAS
*Director of the United States Patent and Trademark Office*